United States Patent
Nieh et al.

(10) Patent No.: US 7,482,211 B2
(45) Date of Patent: Jan. 27, 2009

(54) JUNCTION LEAKAGE REDUCTION IN SIGE PROCESS BY IMPLANTATION

(75) Inventors: Chun-Feng Nieh, Baoshan Township (TW); Chien-Hao Chen, Chuangwei Township (TW); Keh-Chiang Ku, Sindan (TW); Tze-Liang Lee, Hsinchu (TW); Shih-Chang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 129 days.

(21) Appl. No.: 11/523,274

(22) Filed: Sep. 19, 2006

(65) Prior Publication Data
US 2007/0298565 A1    Dec. 27, 2007

Related U.S. Application Data

(60) Provisional application No. 60/815,684, filed on Jun. 22, 2006.

(51) Int. Cl.
*H01L 21/00* (2006.01)
(52) U.S. Cl. ............... 438/162; 438/164; 438/510; 257/297; 257/E21.431; 257/E21.619
(58) Field of Classification Search ............ 438/162, 438/164, 510; 257/297, E21.431, E21.619
See application file for complete search history.

(56) References Cited

U.S. PATENT DOCUMENTS

| | | | | |
|---|---|---|---|---|
| 6,657,223 | B1* | 12/2003 | Wang et al. | 257/19 |
| 2005/0242340 | A1* | 11/2005 | Chidambarrao et al. | 257/19 |
| 2006/0054968 | A1* | 3/2006 | Lee | 257/327 |
| 2006/0065937 | A1* | 3/2006 | Hoffmann et al. | 257/401 |
| 2006/0091490 | A1* | 5/2006 | Chen et al. | 257/458 |
| 2006/0118878 | A1* | 6/2006 | Huang et al. | 257/369 |

OTHER PUBLICATIONS

Semiconductor OneSource_Semiconductor Glossary_search for Doping.*

* cited by examiner

*Primary Examiner*—Thanh V Pham
(74) *Attorney, Agent, or Firm*—Slater & Matsil, L.L.P.

(57) ABSTRACT

A method for forming a semiconductor device is provided. The method includes providing a semiconductor substrate, forming a gate dielectric over the semiconductor substrate, forming a gate electrode on the gate dielectric, forming a stressor in the semiconductor substrate adjacent an edge of the gate electrode, and implanting an impurity after the step of forming the stressor. The impurity is preferably selected from the group consisting essentially of group IV elements, inert elements, and combinations thereof.

19 Claims, 5 Drawing Sheets

JUNCTION LEAKAGE REDUCTION IN SIGE PROCESS BY IMPLANTATION

This application claims the benefit of U.S. Provisional Application No. 60/815,684, filed on Jun. 22, 2006, entitled "Junction Leakage Reduction in SiGe Process by Implantation", which application is hereby incorporated herein by reference.

TECHNICAL FIELD

This invention relates generally to semiconductor devices, and more particularly to the structure and manufacturing methods of metal-oxide-semiconductor devices.

BACKGROUND

Reduction of the size and the inherent features of semiconductor devices (e.g., a metal-oxide semiconductor device) has enabled continued improvement in speed, performance, density, and cost per unit function of integrated circuits over the past few decades. In accordance with a design of the transistor and one of the inherent characteristics thereof, modulating the length of a channel region underlying a gate between a source and a drain of the transistor alters a resistance associated with the channel region, thereby affecting a performance of the transistor. More specifically, shortening the length of the channel region reduces a source-to-drain resistance of the transistor, which, assuming other parameters are maintained relatively constant, may allow an increase in current flow between the source and drain when a sufficient voltage is applied to the gate of the transistor.

To further enhance the performance of MOS devices, stress may be introduced in the channel region of a MOS transistor to improve carrier mobility. Generally, it is desirable to induce a tensile stress in the channel region of an n-type metal-oxide-semiconductor (NMOS) device in a source-to-drain direction and to induce a compressive stress in the channel region of a p-type metal-oxide-semiconductor (PMOS) device in a source-to-drain direction.

A commonly used method for applying compressive stress to the channel regions of PMOS devices is to grow SiGe stressors in the source and drain regions. Such a method typically includes the steps of forming a gate stack on a semiconductor substrate, forming gate spacers on sidewalls of the gate stack, forming recesses in the silicon substrate aligned with the gate spacers, and epitaxially growing SiGe stressors in the recesses. Since SiGe has a greater lattice constant than silicon, it applies a compressive stress to the channel region, which is located between a source SiGe stressor and a drain SiGe stressor.

SUMMARY OF THE INVENTION

In accordance with one aspect of the present invention, a method for forming a semiconductor device is provided. The method includes providing a semiconductor substrate, forming a gate dielectric over the semiconductor substrate, forming a gate electrode on the gate dielectric, forming a stressor in the semiconductor substrate adjacent an edge of the gate electrode, and implanting an impurity after the step of forming the stressor. The impurity is preferably selected from the group consisting essentially of group IV elements, inert elements, and combinations thereof.

In accordance with another aspect of the present invention, a method for forming a semiconductor device includes providing a semiconductor substrate, forming a gate dielectric over the semiconductor substrate, forming a gate electrode on the gate dielectric, forming a dummy spacer on an edge of the gate electrode and the gate dielectric, forming a recess in the semiconductor substrate along a sidewall of the dummy spacer, epitaxially growing SiGe in the recess to form a SiGe stressor, removing the dummy spacer, implanting an impurity in the SiGe stressor, forming a lightly doped source/drain region adjacent the gate electrode, forming a pocket/halo region adjacent the gate electrode, forming a spacer on the edge of the gate electrode and the gate dielectric, and forming a source/drain region adjacent the gate electrode.

In accordance with yet another aspect of the present invention, a semiconductor device includes a semiconductor substrate, a gate dielectric over the semiconductor substrate, a gate electrode on the gate dielectric, and a SiGe stressor in the semiconductor substrate adjacent an edge of the gate electrode. The SiGe stressor includes a p-type impurity and an implantation region with an additional impurity, wherein the additional impurity is selected from the group consisting essentially of nitrogen, fluorine, group IV elements, inert elements, and combinations thereof.

By forming implantation regions after the formation of stressors, the leakage currents of MOS devices are significantly reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
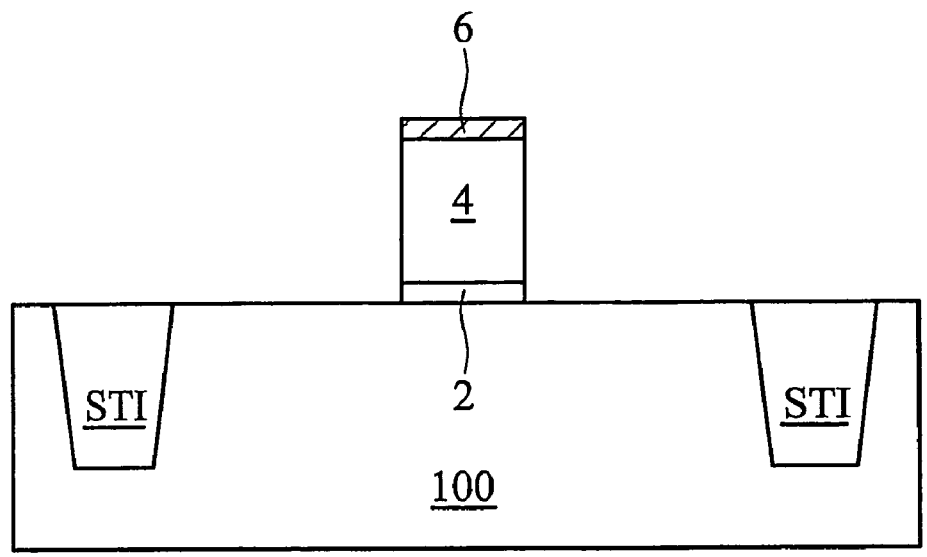
FIGS. 1 through 8 are cross-sectional views of intermediate stages in the manufacture of a PMOS device with SiGe stressors.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for forming PMOS devices with SiGe stressors is provided. The cross-sectional views of intermediate stages in the manufacture of a preferred embodiment of the present invention are illustrated. Throughout the various views and illustrative embodiments of the present invention, like reference numerals are used to designate like elements.

FIG. 1 illustrates a gate stack formed on a substrate 100, which preferably comprises bulk silicon, although other commonly used materials and structures such as silicon on insulator (SOI) can be used. Alternatively, a SiGe substrate with a low germanium-to-silicon ratio is used. Shallow trench isolation (STI) regions are formed to isolate device regions. The gate stack includes a gate electrode 4 on a gate dielectric 2. The gate stack is preferably masked by a hard mask 6, which may be formed of materials such as oxide, silicon nitride, silicon oxynitride, and combinations thereof.

Figure 2:
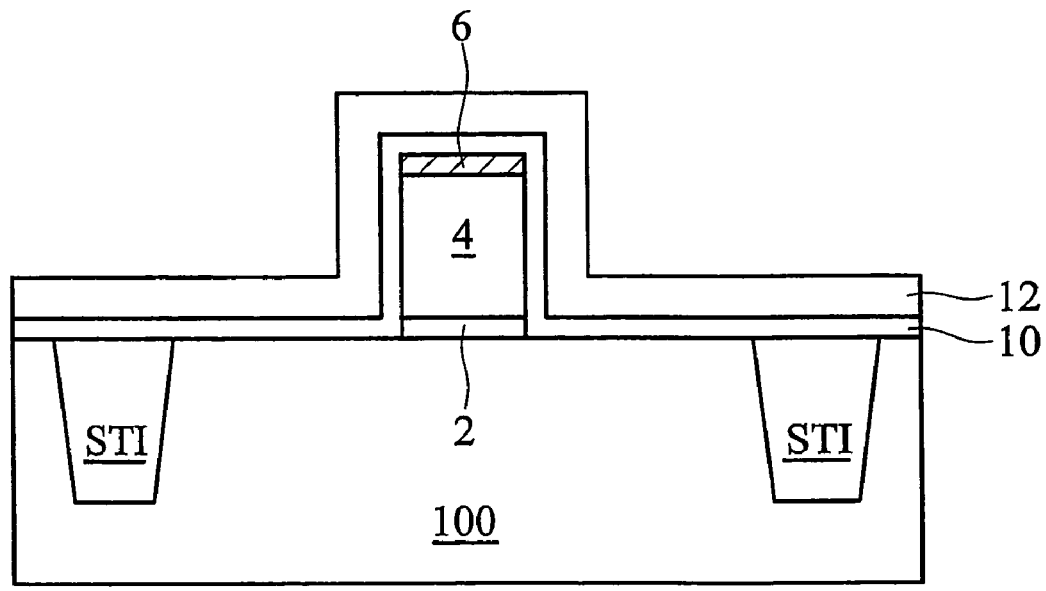

A dummy layer is blanket formed, as shown in FIG. 2. In the preferred embodiment, the dummy layer comprises a liner oxide layer 10 and a nitride layer 12. In alternative embodiments, the dummy layer includes a single or a composite layer, which preferably comprises oxide, silicon nitride, silicon oxynitride (SiON) and/or other dielectric materials. The dummy layer may be formed using common techniques, such as plasma enhanced chemical vapor deposition (PECVD), low-pressure chemical vapor deposition (LPCVD), sub-atmospheric chemical vapor deposition (SACVD), etc.

Figure 3:
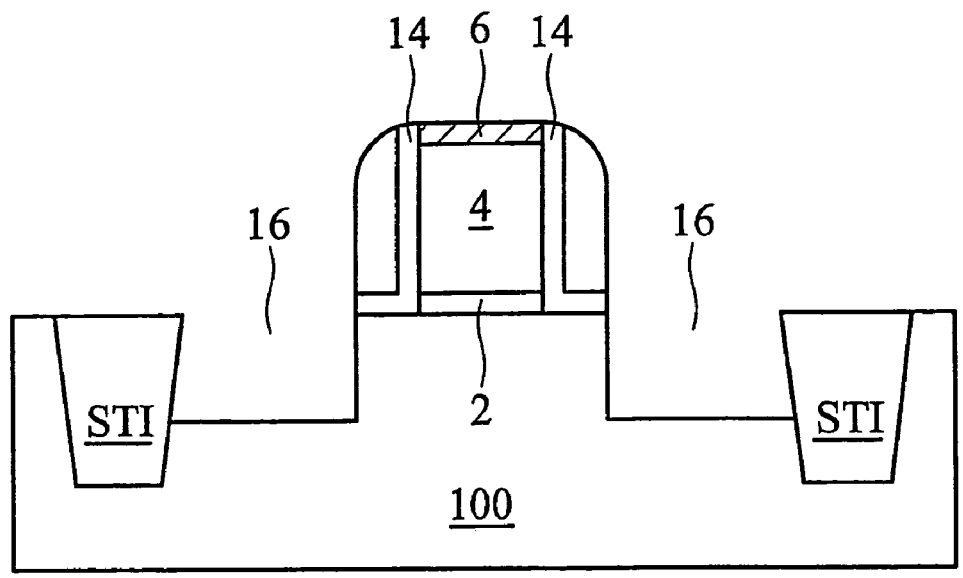

Referring to FIG. 3, liner oxide layer 10 and nitride layer 12 are patterned to form gate spacers 14, which include liner oxide portions and nitride portions accordingly. Recesses 16 are then formed in substrate 100 along the edges of spacers 14, preferably anisotropically. In 90 nm technology, the depth of recesses 16 is preferably between about 500 Å and about 1000 Å, and more preferably between about 700 Å and about 900 Å.

Figure 4:
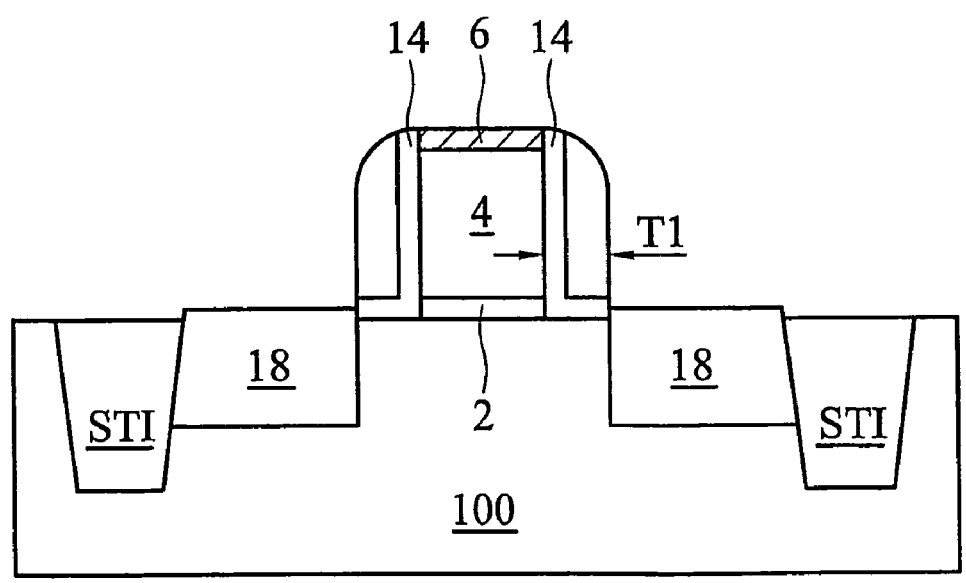

FIG. 4 illustrates the formation of epitaxy regions. A semiconductor material, preferably SiGe, is epitaxially grown in recesses 16 by selective epitaxial growth (SEG), forming epitaxial regions 18. The semiconductor material preferably has a lattice spacing greater than that of the substrate 100. Desired impurities may or may not be doped while the epitaxial growth proceeds. In the preferred embodiment wherein substrate 100 is a silicon substrate, SiGe is grown in the recesses 16. In other embodiments wherein substrate 100 comprises SiGe, it is further preferred that epitaxial regions 18 comprise more germanium than does the substrate 100, so that the lattice spacing in epitaxial regions 18 is greater than the lattice spacing in substrate 100. The formation of epitaxial regions 18 introduces a compressive stress to the channel region. Throughout the description, epitaxial regions 18 are alternatively referred to as SiGe stressors 18.

Figure 5:
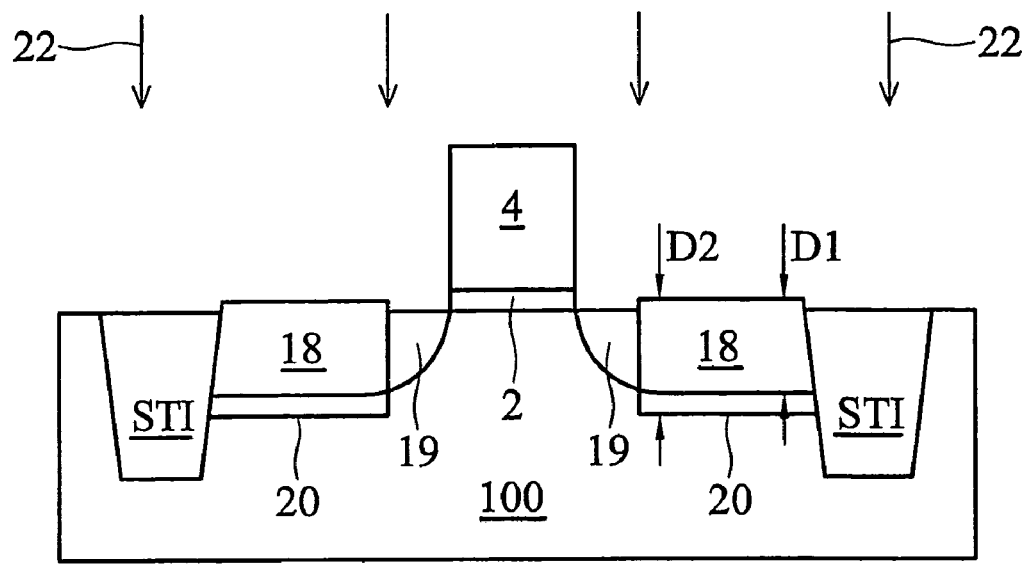

Referring to FIG. 5, spacers 14 and hard mask 6 are removed. In an exemplary embodiment, the silicon nitride portions of spacers 14 and hard mask 6 are removed by etching in phosphoric acid, and the liner oxide portions in spacers 14 are stripped using diluted hydrofluoric acid.

An implantation, as symbolized by arrows 22, is performed, and implantation regions 19 are formed. In the preferred embodiment, group IV elements such as carbon, silicon and germanium are implanted. In other embodiments, inert gases such as neon, argon, krypton, xenon, and/or radon are used. In yet other embodiments, nitrogen and/or fluorine are implanted. It should be noted that an inappropriate implantation may cause the degradation of the channel stress generated by SiGe stressors 18, and thus the energy and the dosage of the implantation needs to be carefully controlled. Preferably, the depth D1 of the implanted region is less than the depth D2 of SiGe stressors 18, and more preferably less than about 50 percent of the depth of the SiGe stressors 18, so that the bonds at interfaces 20 between SiGe stressors 18 and the underlying substrate 100 are not damaged by the implantation. Furthermore, depth D1 is preferably greater than a depth of the subsequently formed lightly doped source/drain regions and pocket/halo regions, although D1 may be deeper or shallower. The implantation is preferably performed using an energy of less than about 4 keV, and more preferably between about 2 keV and about 4 keV, and a dosage of between about $1E14/cm^2$ and about $1E15/cm^2$, and more preferably between about $5E14/cm^2$ and about $7E14/cm^2$. As a result, the implanted impurity has a concentration of less than about $1E21/cm^3$, and more preferably between about $1E20/cm^3$ and about $5E20/cm^3$.

The introduction of certain above-listed impurities, such as carbon, may cause a reduction in lattice spacing, hence a reduction in stress in the channel region. Therefore, the concentration of implanted atoms is preferably low compared to germanium. In an exemplary embodiment, the concentration of the implanted impurity and germanium in implantation regions 19 have a ratio of less than about 0.5%, and more preferably less than about 0.1%.

Typically, when source/drain regions of NMOS devices are implanted, a pre-amorphized implantation (PAI) is preferably performed to reduce the dopant channeling effect and to enhance dopant activation. Preferably, the implantation of SiGe stressors is performed simultaneously with the PAI of NMOS devices if the same impurity elements are used.

Figure 6:
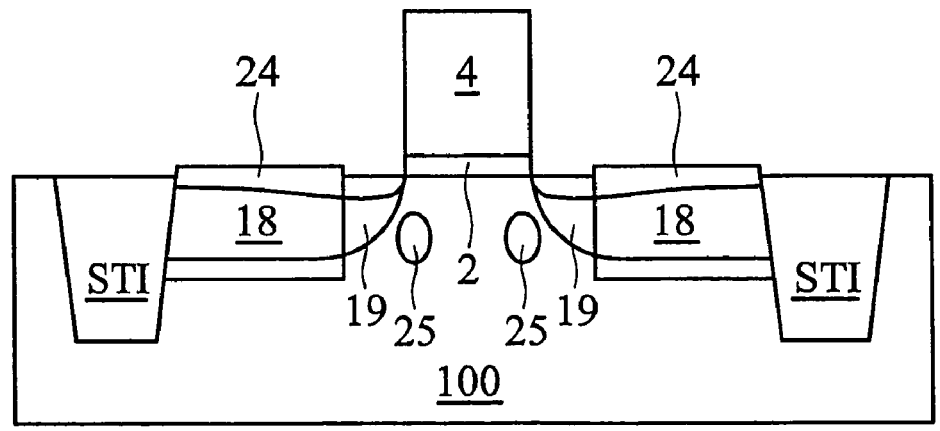

FIG. 6 illustrates the formation of lightly doped drain/source (LDD) regions 24. Preferably, an implantation is performed to introduce p-type impurities, such as boron and/or indium, into substrate 100 and SiGe stressors 18. A further implantation comprising n-type impurities, such as phosphorous and/or arsenic, may be performed to form pocket/halo regions 25. The details for forming LDD regions 24 and pocket/halo regions 25 are known in the art, thus are not repeated herein. One skilled in the art will realize that certain previously discussed steps, such as the steps of forming LDD regions 24 and forming implantation regions 19, can be reversed. Furthermore, the implantation regions 19 may be formed prior to the removal of dummy spacers 14. Accordingly, implantation regions 19 are substantially inside SiGe stressors 18.

Figure 7:
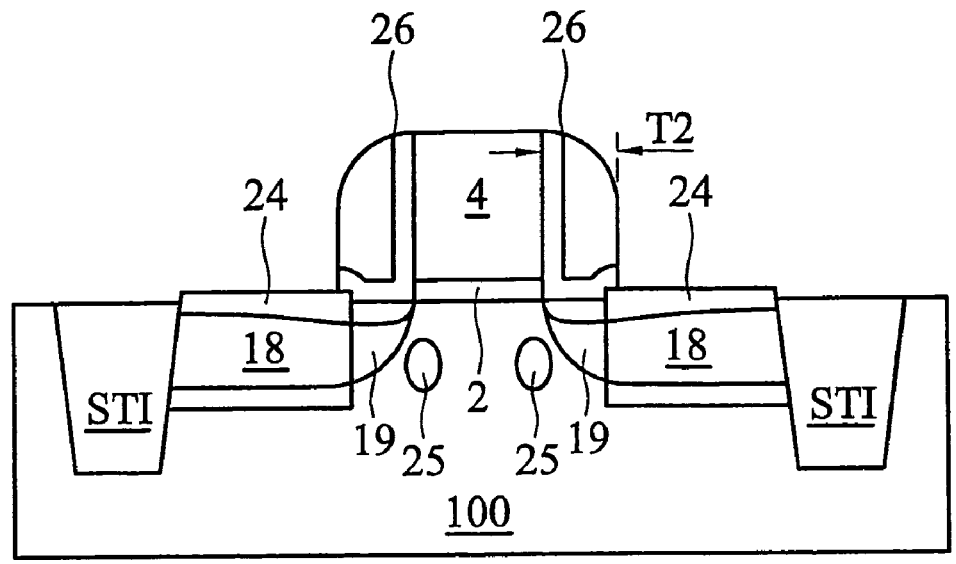

FIG. 7 illustrates the formation of spacers 26. Preferably, a liner oxide layer and a nitride layer are blanket formed. The two layers are then patterned to form spacers 26. Spacers 26 preferably have a thickness T2 greater than a thickness T1 of dummy spacers 14 (refer to FIG. 4), although thickness T2 may be equal to or smaller than thickness T1.

Figure 8:
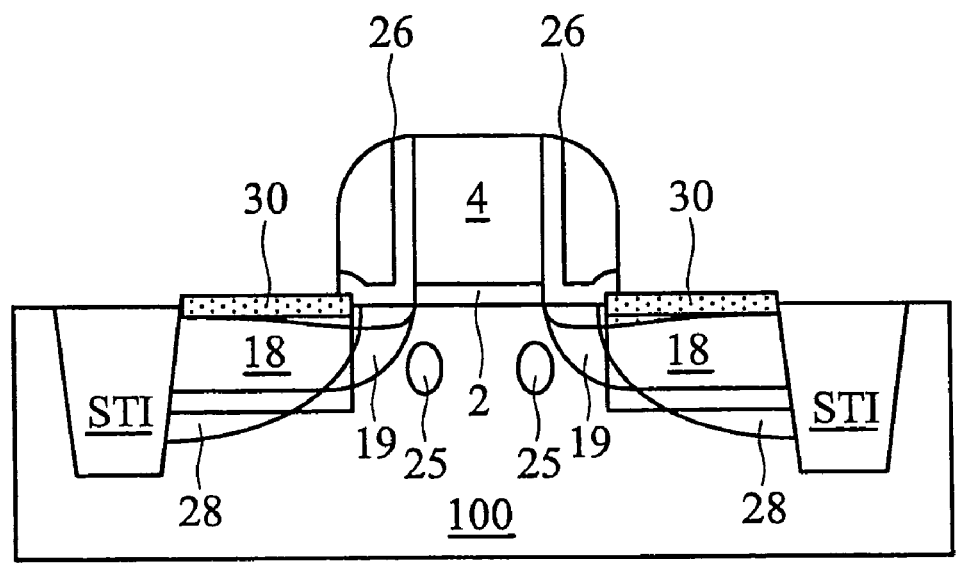

Referring to FIG. 8, deep source/drain regions 28 are formed, preferably by implanting p-type impurities such as boron and/or indium. The resulting source/drain regions 28 are substantially aligned with edges of the spacers 26. FIG. 8 also illustrates the formation of silicide regions 30. As is known in the art, silicide regions 30 are preferably formed by depositing a thin layer of metal, such as titanium, cobalt, nickel, tungsten, or the like, over the devices, including the exposed surfaces of SiGe stressors 18 and gate electrode 4. The substrate is then heated, which causes a silicide reaction to occur wherever the metal is in contact with silicon. After reaction, a layer of metal silicide is formed between the silicon and the metal. The un-reacted metal is selectively removed.

Figure 9:
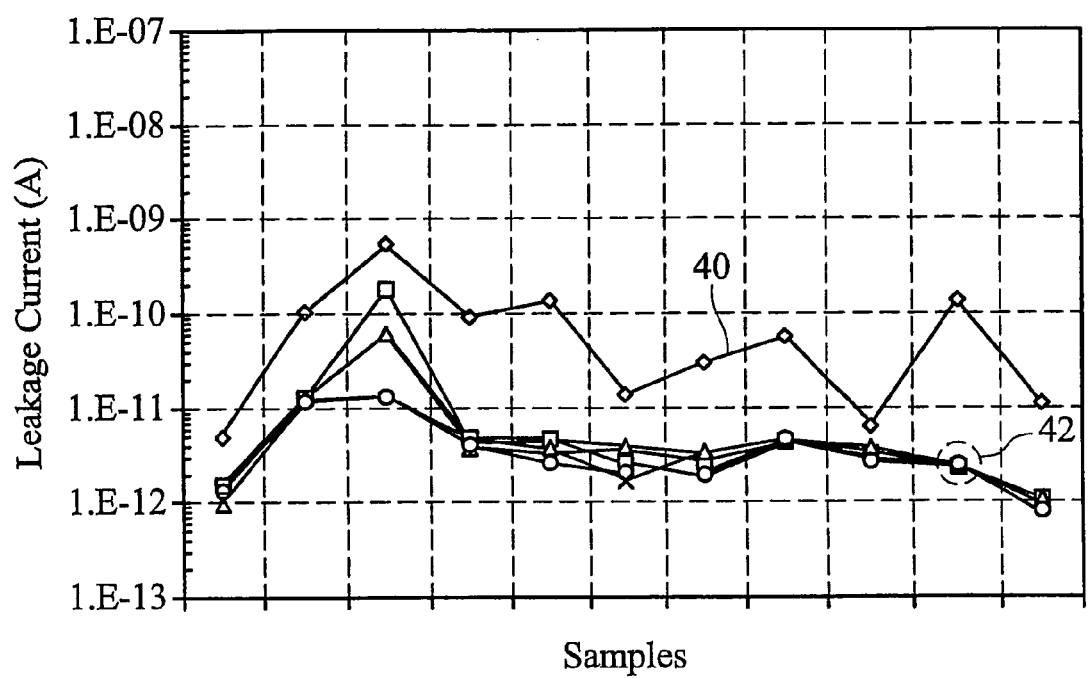
FIG. 9 illustrates a comparison of leakage currents of MOS devices with and without implantations to SiGe stressors.

By forming the implantation regions after forming the SiGe stressors, the leakage currents of PMOS devices are significantly reduced. FIG. 9 illustrates experiment results showing the leakage current improvement. The X-axis represents a plurality of samples formed with different materials, structures and dimensions. The Y-axis represents leakage current. Line 40 is obtained from conventional samples with no implantation regions formed in the SiGe stressors, while lines 42 are samples made with the implantation regions formed in the SiGe stressors, wherein multiple lines 42 are the results of different implantations with different combinations of implantation species, energies and dosages. It is observed that the leakage currents are consistently improved by about one order when the implantation regions are formed in the SiGe stressors. The mechanism of the reduction in leakage is not fully understood. A possible reason may be related to the improvement in the surface of SiGe stressors. The SiGe stressors have a rouginess with some points higher and some points lower. The subsequently formed silicides (or germanosilicides) tend to follow the contour of the surface of the SiGe stressors if the roughness at the surfaces of the SiGe stressor is great enough. The silicide formed on lower points of the SiGe germanium will thus be closer to the junction of source/drain regions. These lower points of the silicide regions may be significant sources of leakage currents. By performing the implantation, the vertical distance between higher points and lower points is reduced, and the lower points are brought higher (while the higher points are brought lower). As a result, the leakage current is reduced.

The implantation on SiGe stressors also causes a reduction in drain-induced barrier lowering (DIBL). Experiment results have revealed that the DIBLs of MOS devices with carbon implanted into the SiGe stressors is lower than the DIBLs of MOS devices with no implantation step performed. At a gate length of about 0.65 μm, the reduction in DIBL is about 10 mV, or about six percent.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor device, the method comprising:
    providing a semiconductor substrate;
    forming a gate dielectric over the semiconductor substrate;
    forming a gate electrode on the gate dielectric;
    forming a stressor in the semiconductor substrate and adjacent an edge of the gate electrode, wherein the stressor has a first lattice spacing different from a second lattice spacing of the semiconductor substrate; and
    implanting an impurity after the step of forming the stressor, wherein the impurity is selected from the group consisting essentially of group IV elements, inert elements, fluorine, nitrogen, and combinations thereof, and wherein the impurity is implanted to a depth less than a depth of the stressor.

2. The method of claim 1, wherein the semiconductor device is a PMOS device, and wherein the stressor comprises SiGe.

3. The method of claim 1, wherein the impurity comprises carbon.

4. The method of claim 1, wherein the step of implanting is performed at an energy of less than about 4 keV.

5. The method of claim 1, wherein the step of implanting is performed with a dosage of between about $1E14/cm^2$ and about $1E15/cm^2$.

6. The method of claim 1, wherein the depth of the impurity is less than 50 percent of the depth of the stressor.

7. The method of claim 1 further comprising:
    forming a lightly doped source/drain (LDD) region with a portion in the stressor;
    forming an n-type pocket/halo region; and
    forming a heavily doped source/drain region with at least a portion in the stressor.

8. The method of claim 7, wherein the step of forming the LDD region is performed after the step of forming the stressor.

9. The method of claim 7, wherein the step of forming the LDD region is performed before the step of forming the stressor.

10. A method for forming a semiconductor device, the method comprising:
    providing a semiconductor substrate;
    forming a gate dielectric over the semiconductor substrate;
    forming a gate electrode on the gate dielectric;
    forming a dummy spacer on an edge of the gate electrode and the gate dielectric;
    forming a recess in the semiconductor substrate along a sidewall of the dummy spacer;
    epitaxially growing SiGe in the recess to form a SiGe stressor, wherein the SiGe stressor has a lattice spacing different from a lattice spacing of the semiconductor substrate;
    removing the dummy spacer;
    implanting an impurity to the SiGe stressor, wherein the impurity is selected from the group consisting essentially of group IV elements, inert elements, fluorine, nitrogen, and combinations thereof wherein the impurity is implanted to a depth less than a depth of the stressor;
    forming a lightly doped source/drain region adjacent the gate electrode;
    forming a spacer on the edge of the gate electrode and the gate dielectric; and
    forming a source/drain region adjacent the gate electrode, wherein the impurity is implanted to a depth less than a depth of the source/drain region.

11. The method of claim 10, wherein the step of implanting is performed before the step of removing the dummy spacer.

12. The method of claim 10, wherein the step of implanting is performed after the step of removing the dummy spacer.

13. A method for forming a semiconductor device, the method comprising:
    providing a semiconductor substrate;
    forming a gate dielectric over the semiconductor substrate;
    forming a gate electrode on the gate dielectric;
    forming a dummy spacer on an edge of the gate electrode and the gate dielectric;
    forming a recess in the semiconductor substrate along a sidewall of the dummy spacer;
    epitaxially growing SiGe in the recess to form a SiGe stressor, wherein the SiGe stressor has a lattice spacing different from a lattice spacing of the semiconductor substrate;
    removing the dummy spacer;
    implanting an impurity to the SiGe stressor wherein the impurity is implanted to a depth less than a depth of the stressor;
    forming a lightly doped source/drain region adjacent the gate electrode, wherein the lightly doped source/drain region comprises an impurity selected from the group consisting essentially of boron, indium, phosphorous, arsenic, and combinations thereof;
    forming a pocket/halo region adjacent the gate electrode, wherein the pocket/halo region comprises an impurity selected from the group consisting essentially of boron, indium, phosphorous, arsenic, and combinations thereof;
    forming a spacer on the edge of the gate electrode and the gate dielectric; and forming a source/drain region adjacent the gate electrode, wherein the source/drain region comprises an additional impurity selected from the group consisting essentially of boron, indium, phosphorous, arsenic, and combinations thereof, and wherein the impurity is implanted to a depth less than a depth of the source/drain region.

14. The method of claim 13, wherein the impurity is selected from the group consisting essentially of carbon, silicon, germanium, nitrogen, fluorine, neon, argon, krypton, xenon, radon, and combinations thereof.

15. The method of claim 13, wherein the step of implanting is performed before the step of removing the dummy spacer.

16. The method of claim 13, wherein the step of implanting is performed after the step of removing the dummy spacer.

17. The method of claim 13, wherein the step of implanting is performed at an energy of less than about 4 keV.

18. The method of claim 13, wherein the step of implanting is performed with a dosage of between about $1E14/cm^2$ and about $1E15/cm^2$.

19. The method of claim 13, wherein the spacer has a greater thickness than the dummy spacer.

* * * * *